310-335
5/17/83 OR 4,384,231 SR

United States Patent [19]

Ishikawa et al.

[11] 4,384,231

[45] May 17, 1983

[54] PIEZOELECTRIC ACOUSTIC TRANSDUCER WITH SPHERICAL LENS

[75] Inventors: Isao Ishikawa, Hino; Hiroshi Kanda, Tokorozawa; Toshio Kondo, Kunitachi, all of Japan

[73] Assignee: Hitachi, Ltd., Tokyo, Japan

[21] Appl. No.: 145,146

[22] Filed: Apr. 30, 1980

[30] Foreign Application Priority Data

May 11, 1979 [JP] Japan .............................. 54-57096
Jun. 25, 1979 [JP] Japan .............................. 54-79209

[51] Int. Cl.[3] .............................. H01L 41/08

[52] U.S. Cl. .............................. 310/335; 310/337; 29/25.35

[58] Field of Search .............................. 310/334–337; 128/660; 73/632, 642; 29/25.35

[56] References Cited

U.S. PATENT DOCUMENTS

| | | | |
|---|---|---|---|
| 2,949,772 | 8/1960 | Kritz | 310/335 X |
| 3,958,559 | 5/1976 | Glenn et al. | 310/335 X |
| 4,001,766 | 1/1977 | Hurwitz | 310/335 X |
| 4,044,273 | 8/1977 | Kanda et al. | 310/335 X |
| 4,097,835 | 6/1978 | Green | 310/335 X |
| 4,184,094 | 1/1980 | Kopel | 310/335 |

*Primary Examiner*—Mark O. Budd
*Attorney, Agent, or Firm*—Antonelli, Terry & Wands

[57] ABSTRACT

An acoustic spherical lens wherein a hemispherical hole is formed from a bubble which appears owing to the expansion of resudual gases in a lens material employing silica, and the hemispherical hole is used as a lens surface.

6 Claims, 37 Drawing Figures

PIEZOELECTRIC ACOUSTIC TRANSDUCER WITH SPHERICAL LENS

BACKGROUND OF THE INVENTION

This invention relates to an acoustic spherical lens and a method of manufacturing the same. More particularly, it relates to an acoustic spherical lens suitable for use as an acoustic wave focusing means in microscopes, especially ones utilizing high frequency acoustic energy, and to a method of manufacturing the same.

Since, in recent years, the generation and detection of high frequency acoustic waves reaching 1 GHz have become possible, the acoustic wavelength in the water has attained approximately 1 micron, and accordingly, microscopes exploiting acoustic energy have been studied.

In such apparatuses, it is important how a fine focused acoustic beam is prepared. A specific example of the prior art will be described with reference to FIG. 1. In the figure, a circular cylindrical crystal 20 of sapphire or the like has one end face which is a flat surface 21 optically polished, and the other end face which is provided with a hemispherical hole 30. A piezoelectric transducer 10 is disposed on the flat surface 21 of the crystal 20. A radio frequency signal is applied to the piezoelectric transducer 10 so as to radiate RF acoustic waves of plane waves into the crystal 20. The plane acoustic waves are focused on a predetermined focal point S by a concave lens formed by the boundary between the crystal 20 and a medium 40 as defined on the hemispherical hole 30. As is well known, when the ratio between the focal length and the numerical aperture, in other words, the F-number of the lens is sufficiently small, an extremely narrow acoustic beam can be prepared by this construction. The focused acoustic beam is subjected to disturbances such as reflection, scattering, transmission and attenuation by a specimen (not shown) located in the vicinity of the focal point. By detecting the disturbed acoustic energy, therefore, an electric signal reflective of the elastic property of the specimen can be obtained. For the detection of the acoustic energy, the foregoing crystal system may be utilized again. Alternatively, a similar crystal system may be confocally opposed and used.

As apparent from the above description, the prior art has its focusing based on the concave lens which exploits the difference of acoustic velocities in the crystal and the medium. Accordingly, in order to obtain a spherical lens having an excellent focusing property, it is essential to endow a crystal with an excellent flatness and to form a hemispherical hole of excellent sphericalness. More specifically, a spherical surface must not have an unevenness exceeding at least 1/10 of the acoustic wavelength in order to operate as the lens. This corresponds to the order of 0.1 μm in case of acoustic waves at 1 GHz.

Moreover, since the attenuation of acoustic waves in the medium (usually, water) from the lens front to the focal point is very heavy, it needs to be avoided by forming a hemispherical hole of a minute numerical aperture of, for example, 0.2 mm and reducing the distance from the lens front to the focal point.

In the prior art, such a lens is machined by the polishing method. The machining based on the polishing method is an extraordinarily difficult job, and a lens with an aperture of 0.5 mm is laboriously fabricated.

SUMMARY OF THE INVENTION

This invention has been made in view of the above drawbacks, and has for its object to provide an acoustic spherical lens which has a minute numerical aperture and whose surface is a mirror surface, as well as a method of manufacturing the same.

It is known in the art that in the case of producing glasses such as fused silica or in the case of utilizing silica, quartz etc., bubbles attributed to residual gases etc. exist or appear within the materials. It is extensively known that the removal of the bubbles determines the quality of the materials. In this regard, when the bubbles in, for example, silica have been carefully observed, it has been found that the bubble has a very good sphericalness, its boundary defining an excellent mirror surface which is never possible with the polishing method. In fact, when an experiment on the focusing of acoustic waves at 1 GHz has been conducted by the use of an acoustic spherical lens as shown in FIG. 2 in which a silica plate 50 including a bubble has its bubble part 51 scraped off therefrom and in which a piezoelectric transducer 10 is stuck on an end face 52 opposite to the bubble part 51 of the silica plate 50, it has been confirmed that the acoustic spherical lens exhibits a very good focusing property and is excellent as a spherical lens for focusing the high frequency acoustic waves. Bubbles which are sporadical in a silica plate exist as spheres in various sizes ranging from larger ones of 0.5 mm to smaller ones of 10 μm. It is therefore possible to fabricate spherical lenses which have minute numerical apertures unfeasible with the polishing method as well as excellent flatnesses and sphericalnesses. Emphasis is to be placed on the fact that, although the existence of the bubbles themselves has heretofore been known, it is the substance of this invention that the bubbles existent in the vitreous materials have been found to be very useful for the acoustic spherical lenses. This invention shall include also a method for forming and utilizing such bubbles in a process which can be put into industrial production.

DESCRIPTION OF THE PREFERRED EMBODIMENTS

The first embodiment of this invention will be described with reference to FIGS. 3(*a*), 3(*b*), 4, 5(*a*), 5(*b*), 6(*a*) and 6(*b*).

Figure 3A:
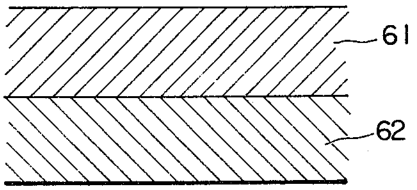
Figure 3B:
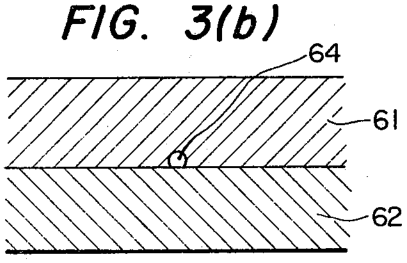

Two silica plates 61 and 62 each of which has had both its surfaces polished well are stacked as shown in FIG. 3(*a*). When the stacked structure is heated in a furnace up to a temperature near the melting point of silica, a gas intervening in the contact surfaces of the silica plates concentrates on one point in the perfect spherical shape. When the structure is cooled in this state, it is often experienced that a perfect sphere 64 is found near the contact surface of the silica plate 61 as shown in FIG. 3(*b*).

There will be stated the sequence of operations for fabricating spherical lenses in large quantities by exploiting this phenomenon.

Figure 4:
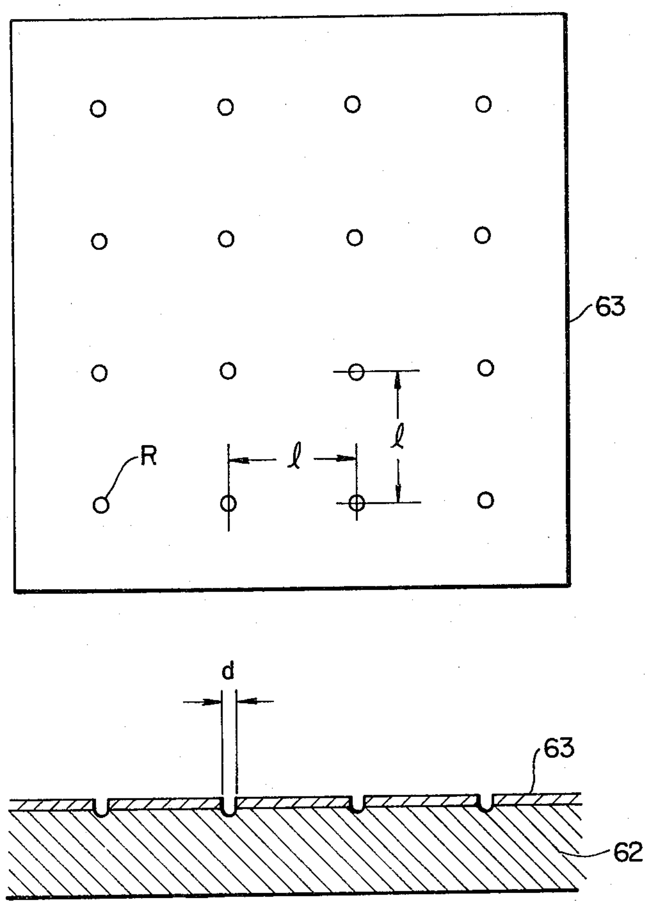

As illustrated in FIG. 4, the upper surface of the silica plate 62 is covered with a mask 63 in which circles R having appropriate diameters d (0.1 mm$\phi \sim$0.05 mm$\phi$) are regularly arranged at spacings l. When etching is carried out in this state, the silica plate 62 has only its parts of the circles R etched, so that a large number of concave parts can be formed.

Figure 5A:
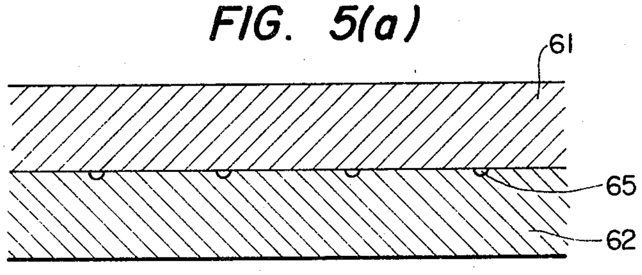
Figure 5B:
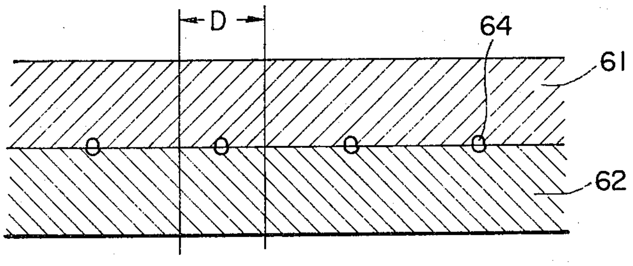

When the silica plate 62 thus formed with the concave parts and the silica plate 61 are stacked as shown in FIG. 5(*a*), a gas in a specified volume can be confined in each of the concave parts 65 at the contact interface of both of the plates. When, under this state, the silica plates are heated in a furnace up to the vicinity of the melting point of silica, perfect spheres 64 as shown in FIG. 5(*b*) can be formed in the contact surface of the silica plate 61 by the gas confined in the concave parts.

The plate structure having the perfect spherical holes 64 is polished from the side of the silica plate 62 until the polished surface reaches the equatorial plane of the spheres 64.

Figure 6A:
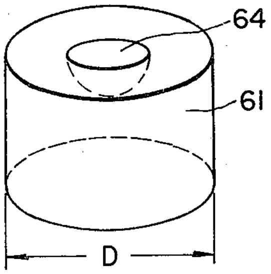
Figure 6B:
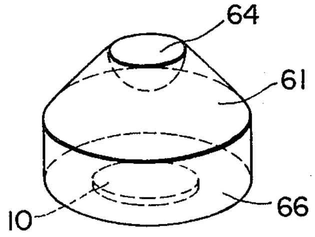

Thus, hemispherical holes can be formed on the surface of the silica plate 61 in large numbers. The shapes of the holes are precisely measured, only hemispheres in a required shape are selected, and the silica plate 61 is cut out into the shape of a circular cylinder with a diameter D as shown in FIG. 6(*a*). Subsequently, as shown in FIG. 6(*b*), the circular cylinder is worked into a predetermined lens form, and a piezoelectric transducer 10 is stuck on an end face 66 opposite to the hemispherical hole 64. Then, a spherical lens is obtained.

Although, in the present embodiment, the silica plates have been employed, it is to be understood that similar effects are produced even with other glasses including flint glass, Kovar glass, crown glass, T-40 glass, etc.

Figure 7A:
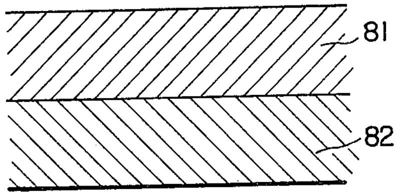
Figure 7B:
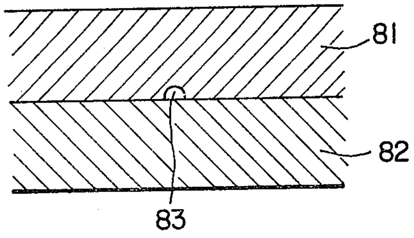
Figure 8:
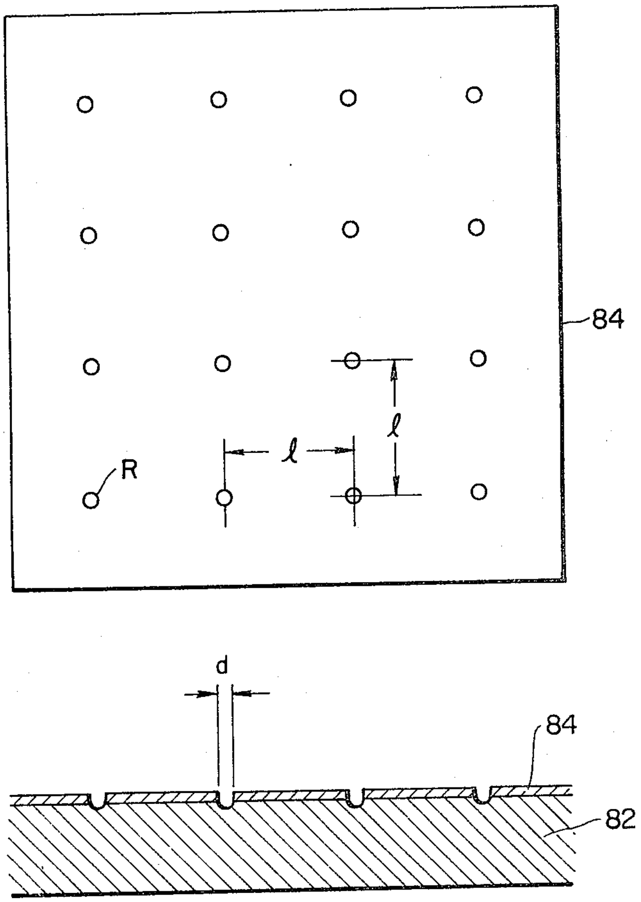

The second embodiment exploits the fact that the same phenomenon as in the first embodiment arises in the melted surface between glass and metal. As shown in FIG. 7(*a*), a Kovar glass plate 81 and a Kovar plate 82 both surfaces of which have been polished well are stacked. When the stacked structure is heated in a furnace up to a temperature near the melting point of Kovar glass, absorbed gases outgassed from both the plates and gases intervening between the contact surfaces of both the plates concentrate on one point in the shape of a perfect sphere. When the structure is cooled in this state, it is often experienced that a point sphere 83 remains in the vicinity of the contact interface of both the plates as shown in FIG. 7(*b*). Regarding the present embodiment, there will be described the sequence of operations for fabricating spherical lenses in large quantities by making use of this phenomenon. Likewise to the first embodiment, the upper surface of the Kovar plate 82 as shown in FIG. 8 is covered with a mask 84 in which circles R having appropriate diameters d (0.1 mm$\phi \sim$0.05 mm$\phi$) are regularly arranged at spacings l. Etching is carried out in this state so as to prepare the Kovar plate in which a large number of concave parts are regularly arranged. The Kovar plate 82 thus prepared and the Kovar glass plate 81 are stacked as in the first embodiment, and the stacked structure is heated up to a temperature near the melting point of Kovar glass. Then, the gases in a specified volume confined in the concave parts in the contact interface of both the plates appear as bubbles in the perfect spherical shape. The structure is cooled and solidified in this state. Then, perfect spheres can be formed in the contact interface of both the plates. The subsequent process for obtaining spherical lenses is the same as in the first embodiment, and can be easily performed. Unlike the first embodiment, the present embodiment utilizes the melted surface between the different substances. It is therefore desirable to employ the glass and the metal which have thermal expansion coefficients close to each other. It is to be understood, however, that the invention is not restricted to the materials in the present embodiment.

Figure 9:
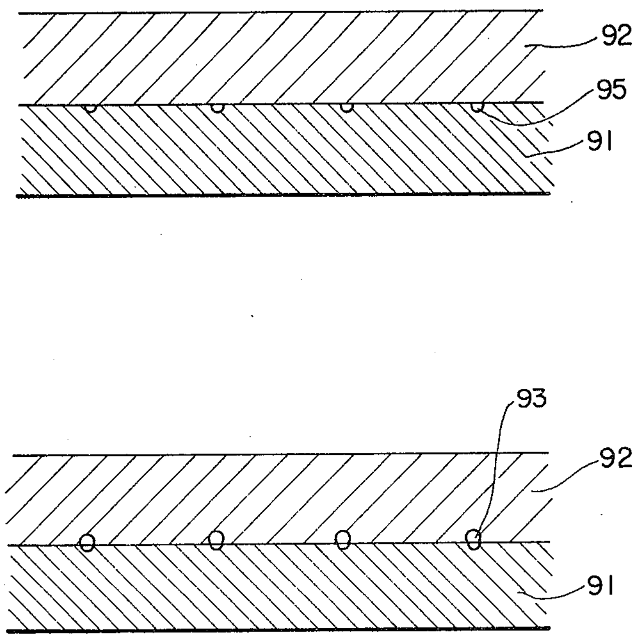

The third embodiment positively exploits a material which produces gases being the sources of bubbles, in the foregoing embodiments. When a silica plate 92 is to be stacked on a silica plate 91 formed with concave parts 95 as illustrated in FIG. 9(*a*), an absorbent material, for example, frittered glass powder is put into the concave parts 95. Since the frittered glass is highly absorbent and contains large quantities of gases adsorbed therein, it produces large quantities of gases when heated and fused, and perfect spheres 93 as shown in FIG. 9(*b*) can be formed in the contact surface of the silica plate 92. Similarly to the first and second embodiments, spherical lenses can be readily fabricated by utilizing the bubbles appearing owing to the intervention of the frittered glass powder in the concave parts.

Figure 10A:
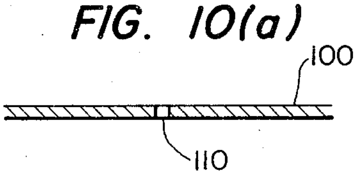
Figure 10B:
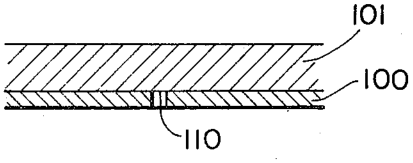
Figure 10C:
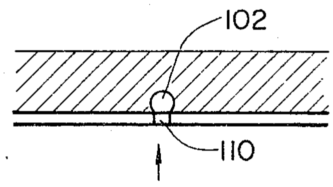

The fourth embodiment causes a bubble to appear by externally introducing a gas between metal and glass which have been polished into mirror surfaces. As shown in FIG. 10(*a*), an orificed plate 100 is prepared by providing a Kovar plate with a small orifice 110 having a diameter of about 0.03 mm. A Kovar glass plate 101 is stacked on the orificed plate as shown in FIG. 10(*b*), and the stacked structure is heated to a temperature near the melting point of Kovar glass. Under this state, a gas is blown through the orifice 110 towards the Kovar glass plate. When the pressure of the gas is appropriately selected, a bubble 102 can be formed along the orifice 110 as shown in FIG. 10(*c*), and moreover, it can be prevented from separating from the orifice. When the structure is cooled and solidified in this state, the Kovar glass plate having a spherical hole can be prepared as in the foregoing embodiments. The present embodiment has the first feature that the diameter of the bubble can be kept invariable in the cooling by delicately controlling the gaseous pressure during the cooling, and the second feature that the diameter of the sphere of the bubble can be made a desired value by adjusting the gaseous pressure and selecting the orifice diameter.

The above four embodiments cannot perfectly control the diameters of the bubbles, and are unsuitable for manufacturing spherical lenses in quite the same shape in large quantities. For the industrial production, also this problem should desirably be solved. All the ensuing embodiments concern a method wherein the same spherical holes are formed in large quantities by the replica method from a single spherical hole once obtained with any of the foregoing embodiments.

Figure 11:
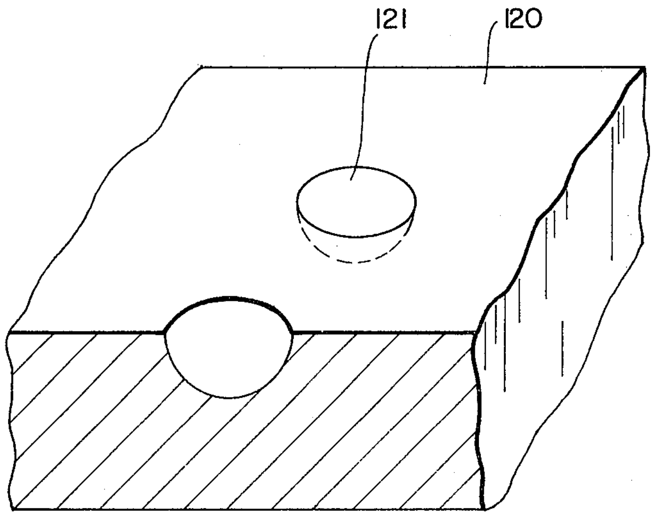
Figure 12A:
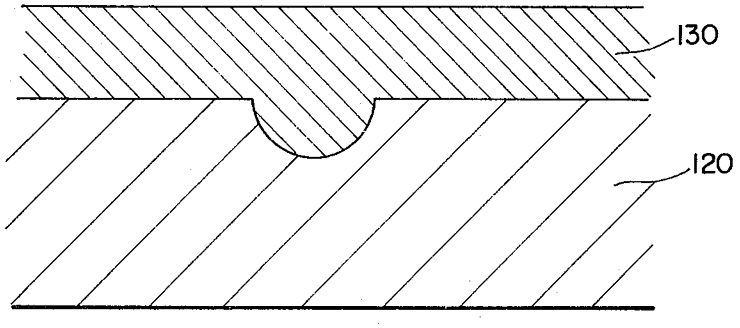
Figure 12B:
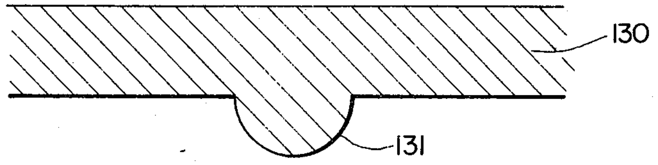

The fifth embodiment starts from a glass plate 120 as shown in FIG. 11 which has a spherical hole 121 formed by the previous embodiment. The whole surface of the glass plate 120 is coated with an organic substance as shown in FIG. 12(*a*), and after heating and drying the structure, the glass plate 120 and an organic plate 130 are separated. Then, a sphere 131 in quite the inverse shape to the shape of the surface of the glass plate 120 as shown in FIG. 12(*b*) can be reproduced onto the organic plate 130. The inventors have found out that a mixture consisting of furfural ($C_5H_6O_2$)+pyrrole ($C_4H_5N$) is suitable as the organic material for use in this invention. It has been revealed that, when selected to be furfural: pyrrole=4:6, the mixture has an appropriate viscosity and exhibits a good carbonization efficiency in a baking and carbonization process in a step to be described later.

As a catalyst for polymerization, hydrochloric acid (at a concentration of 36%) is diluted 4~5 times with distilled water and is added 1~3% to the mixture consisting of furfural and pyrrole. When the resultant mixture is heated to 50~80° C. and stirred, it begins to polymerize in 2~10 minutes, and it becomes a viscous liquid after completion of the polymerization reaction.

The organic material 130 on which the shape on the silica plate has been reproduced is first subjected to a preliminary solidification by heating it in the air from the room temperature to 80° C. at a rate of at most 0.5° C./min. Further, it is heated to 450° C. in a vacuum. Thus, a solidification process is completed.

Subsequently, the organic material 130 is heated to 1,000° C. in a vacuum at a temperature raising rate of about 10° C./min., and it is finally heated to 1,300° C.~2,500° C. Then, the organic material 130 turns into glassy carbon.

Figure 13A:
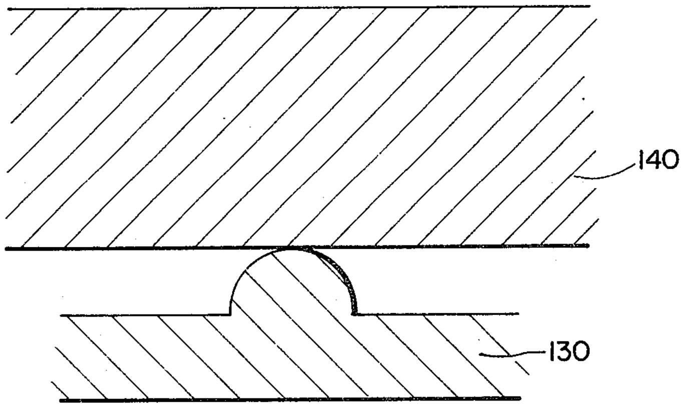
Figure 13B:
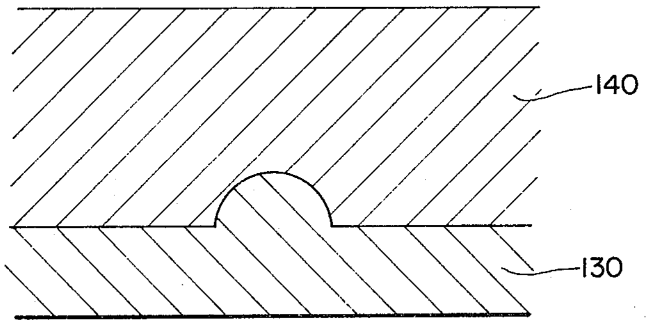

A silica glass plate 140 having a predetermined thickness is stacked on the glassy carbon plate 130 as shown in FIG. 13(*a*), and the stacked structure is heated in a certain specified atmosphere. Then, the silica glass is fused and bonded onto the glassy carbon plate 130 as shown in FIG. 13(*b*). When the structure is solidified in this state, the shape on the surface of the glassy carbon plate 130 can be transferred onto the surface of the silica glass 140 though the transferred shape is quite inverse.

Figure 14A:
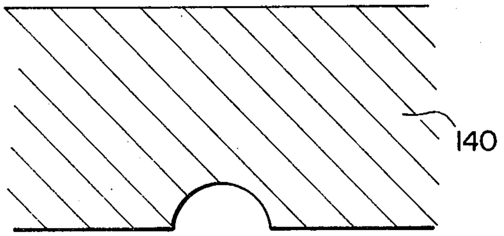
Figure 14B:
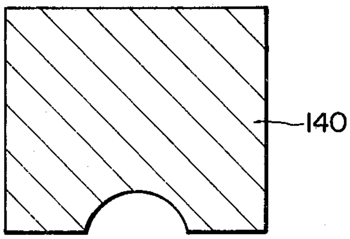
Figure 14C:
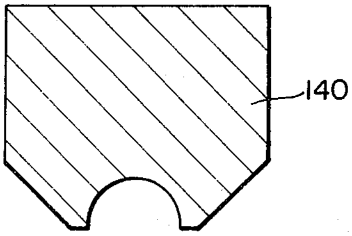

It is the same as in the foregoing four embodiments that the silica glass 140 thus obtained is worked by steps as shown in FIGS. 14(*a*)–14(*c*), whereby a spherical lens in the final shape can be fabricated. In the present embodiment, description has been made of the case where the natural or artificial bubble existent in the glass material is utilized for the reference hemisphere. It is to be understood, however, that even a mold which utilizes a hemisphere formed by the conventional glass polishing can be satisfactorily used for the present replica method if the accuracy of finishing thereof lies within a required accuracy. The feature of the present embodiment is that once the single reference hemisphere has been prepared with any method, a large number of spherical lenses in the identical shape can be thereafter fabricated by the reproduction or transfer.

The sixth embodiment forms a hemispherical hole through polishing, not through transfer, by utilizing the hemispherical replica on the organic material obtained in the fifth embodiment.

Figure 15A:
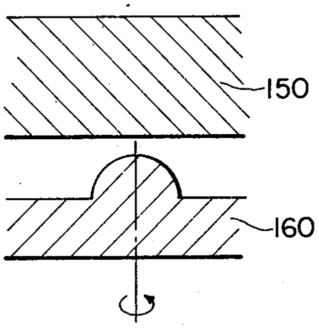
Figure 15B:
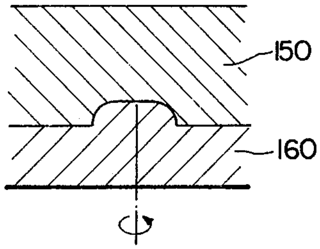
Figure 15C:
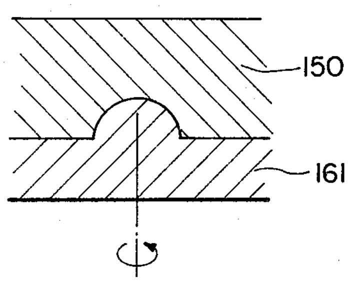

First of all, glassy carbon plates 160 shaped like the plate 130 in FIG. 13(*a*) are prepared in large quantities by the preceding step of the fifth embodiment. Since glassy carbon is very high in hardness, it is intended to be used in lieu of a drilling needle. As illustrated in FIG. 15(*a*), the glassy carbon plate 160 is rotated while pushing it against a material to be provided with a hemispherical hole, for example, a glass plate 150. Then, the glass plate 150 is gradually polished. In this case, diamond powder or the like may be used as grains. In case where the glass plate is hard, the convex part of the glassy carbon plate serving as a tool rubs off, and eventually the tip of the sphere collapses as shown in FIG. 15(*b*). Then, a similar process is performed with a new glassy carbon plate 161. According to the inventors' experience, in case of ordinary glasses, a glass plate can be formed with a hemispherical hole by the use of two to three glassy carbon plates (FIG. 15(*c*)). The present embodiment is very useful when it is desired to form the hemispherical hole in that material to be reproduced by the replica method whose property changes due to fusion, for example, a crystalline material such as sapphire and ruby.

The seventh embodiment concerns an example which employs a replica without using any bubble even in case of forming a hemispherical hole. The essence has taken note of the situation wherein when a minute metal ball is placed in a lens material such as silica heated into its fused state and is taken out after cooling and solidification, a hole left behind is a spherical hole.

Figure 16:
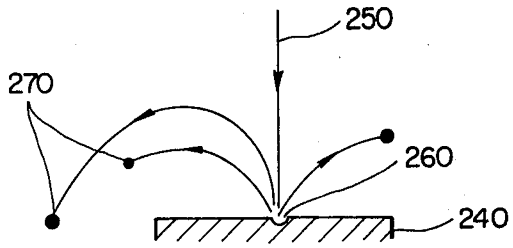

A first step in the manufacturing process according to the present embodiment is to prepare minute metal balls. As illustrated in FIG. 16, when a metal material 240 is put into a vacuum and is bombarded with a focused electron beam of high energy 250, the irradiated part 260 is fused and struck out in the form of bulks 270 having certain sizes. The bulks are cooled and solidified during fall, and they harden in the perfect spherical state owing to surface tensions because they lie within the vacuum. It has been known in the art that nearly ideal metal balls which have diameters of 10~500 μm and whose surface unevenesses are less than several tens Å are obtained in this way. The metal material may be tungsten, molybdenum or the like, and only requires to have a melting point higher than that of the lens material as will be stated later.

Figure 1:
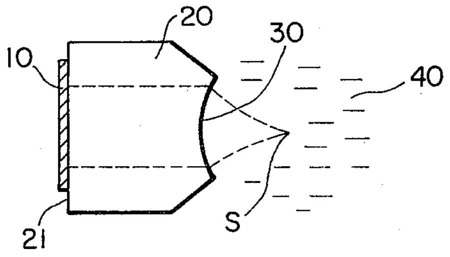
FIG. 1 is a view for explaining the construction of a prior-art acoustic spherical lens.
Figure 2:
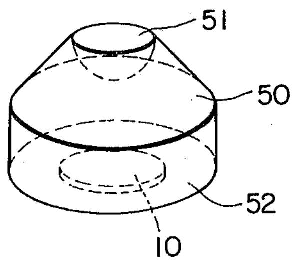
FIG. 2 is a stereographic view showing an example of an acoustic spherical lens according to this invention, FIGS. 3(*a*) and 3(*b*) are diagrams for explaining the principle of this invention, FIGS. 4, 5(*a*)–5(*b*), and 6(*a*)–6(*b*) are views for explaining a first embodiment of this invention, FIGS. 7(*a*), 7(*b*) and 8 are views for explaining a second embodiment of this invention, FIGS. 9(*a*) and 9(*b*) are views for explaining a third embodiment of this invention, FIGS. 10(*a*), 10(*b*) and 10(*c*) are views for explaining a fourth embodiment of this invention, FIGS. 11, 12(*a*)–12(*b*), 13(*a*)–13(*b*), and 14(*a*)–14(*c*) are views for explaining a fifth embodiment of this invention, FIGS. 15(*a*), 15(*b*) and 15(*c*) are views for explaining a sixth embodiment of this invention, FIGS. 16, 17(*a*) and 17(*b*) are views for explaining a seventh embodiment of this invention, and FIGS. 18, 19(*a*)–19(*b*), 20(*a*)–20(*b*), 21 and 22 are views for explaining an eighth embodiment of this invention.
Figure 17A:
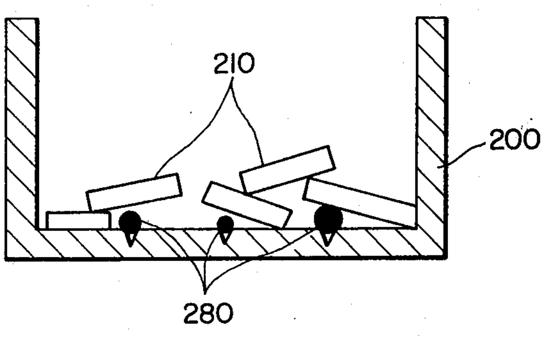
Figure 17B:
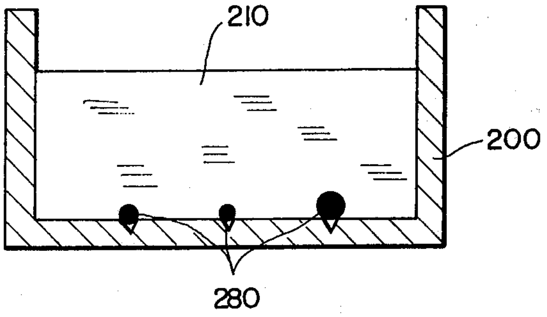

Secondly, pieces of the lens material (silica, quartz, various glasses etc.) 210 and the metal balls 280 obtained by the above step are placed in a vessel 200 which is made of carbon or the like and whose bottom is provided with suitable concaves (FIG. 17(*a*)), and the whole structure is heated to a temperature above the melting point of the lens material and below the melting point of the metal balls, thereby to fuse only the lens material 210. At this time, the metal balls come to lie on the bottom of the vessel 200 owing to their own weights (FIG. 17(*b*)). Thirdly, bubbles and gases produced with the fusion are caused to get out by means of a vacuum pump etc., whereupon the structure is gradually cooled. Then, the lens material solidifies in the form in which it encloses the metal balls in its bottom. Fourthly, the lens material is cut out into the shape of a circular cylinder in a manner to contain the metal ball therein, and the metal ball is removed. Then, the remaining hole is a hemisphere being very excellent as the replica of the metal ball surface, and a lens surface whose surface accuracy is within several tens Å is formed. Fifthly, some flat optical polishing is carried out. Thus, the spherical lens shown in FIG. 2 is fabricated.

In the present embodiment, since the hemisphere is obtained as the replica of the metal ball, the so-called spherical polishing is unnecessary. Besides, it is to be understood that when a large number of metal balls are used, a multitude of lenses can be fabricated at one time. In order to obtain lenses having desired numerical apertures, metal balls with desired diameters may be selected by sieving from among the metal balls prepared by the first step, whereupon the above process may be performed. In this case, in order to position the large number of metal balls, it is desirable that ditches are dug in the bottom of the carbon vessel 200 by an electron beam processing machine or the like in advance, the metal balls being located in the ditches. When the depths of the ditches are properly selected, the replicas to be formed after the third step can be made somewhat smaller than the hemispheres. This brings forth the advantage that the metal balls come off naturally, conjointly with the fact that the material of the metal balls is greater than the lens material in the coefficient of thermal expansion.

In the gradual cooling after the second step, the vessel 200 is turned upside down while the lens material is sufficiently fluid. Then, the metal balls fall slowly owing to their own weights. Thus, the glass material solidifies in the form in which it encloses the metal balls in positions determined in relation to its solidification rate. When circular cylinders including a plane passing through the positions are cut out and the metal balls are removed, hemispherical replicas are obtained as in the preceding embodiment.

The eighth embodiment fabricates spherical lenses through reproduction with a mold by utilizing the spherical lens obtained in the foregoing embodiment.

Figure 18:
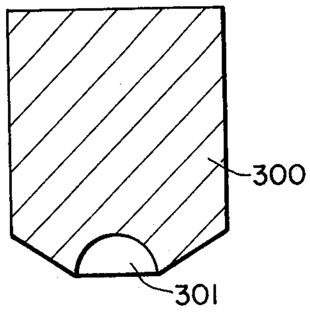

The manufacturing method according to the present embodiment starts from a pattern for a lens, 300 as shown in FIG. 18 which includes a concave 301 obtained in the foregoing embodiment. First, using the lens pattern 300, a female mold is prepared.

Figure 19A:
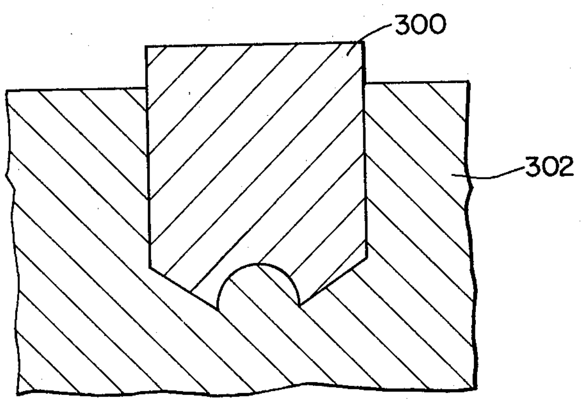
Figure 19B:
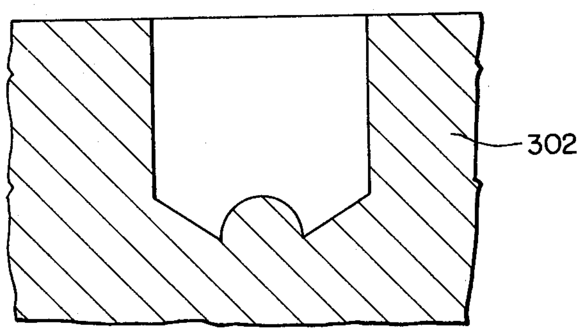

As a first expedient therefor, as shown in FIG. 19(*a*), the lens pattern 300 is buried in a substance 302 into which the shape of the lens pattern 300 can be precisely transferred (a substance such as, for example, plaster and plastics), whereupon the mold substance 302 is hardened. When both are separated, the mold 302 in a shape shown in FIG. 19(*b*) can be fabricated.

Figure 20A:
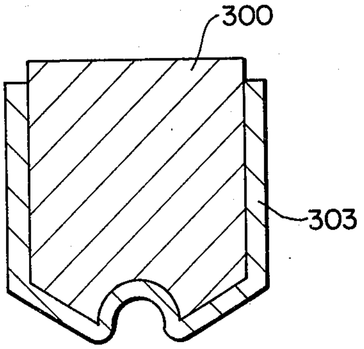
Figure 20B:
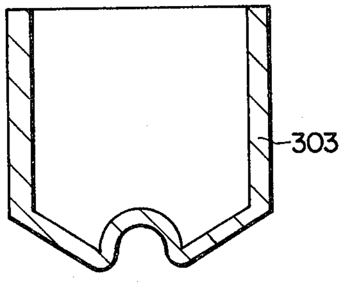

As a second expedient, the surface of the lens pattern 300 is plated with a metal 303 to a predetermined thickness as shown in FIG. 20(*a*), whereupon both are separated. Then, the mold 303 in a shape shown in FIG. 20(*b*) can be fabricated.

A substance which becomes glassy carbon when subjected to a sintering treatment is poured into the mold prepared by either of the above expedients. The glassy carbon is a carbonized material obtained by heating and hardening an organic matter. It is a carbon material whose behavior is different from that of usual graphite and is rather similar to that of glass, and it has the feature of exhibiting quite no anisotropy.

As the organic substance, it is effective to employ the mixture consisting of furfural ($C_5H_6O_2$) and pyrrole ($C_4H_5N$) as previously stated. It has been revealed that, when selected to be furfural: pyrrole=4:6, the mixture has an appropriate viscosity and exhibits a good carbonization efficiency in a baking and carbonization process in a step to be described later. Hydrochloric acid (at a concentration of 36%) diluted 4∼5 times is added 1∼3% to the organic substance as a catalyst for polymerization, and the resultant mixture is heated to 50∼80° C. and stirred. Then, the mixture polymerizes and becomes a viscous liquid in 2∼8 minutes.

Figure 21:
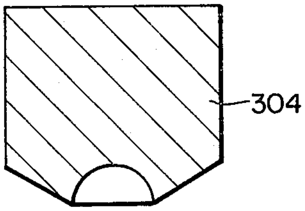

The liquid is heated in the air from the room temperature to 80° C. at a rate of at most 0.5° C./minute. Then, the preliminary heating is completed. Since the glassy carbon is separated from the mold under this state, it is taken out. When it is heated in a vacuum up to 1,300° C.∼2,500° C., a spherical lens 304 perfectly turned into glassy carbon as shown in FIG. 21 can be fabricated. It has been confirmed that the spherical lens 304 made of glassy carbon as thus fabricated has a conductivity of $\sim 10^{-1}\Omega$.cm and mechanical properties similar to those of glasses, a Young's modulus of $\sim 3\times 10^{10}$ N/cm$^2$, a density of $1.5\times 10^3$ kg/m$^3$ and an acoustic velocity of ∼4,600 m/s, which are equivalent to the performance of pyrex glass.

Since the glassy carbon separates from the mold as described above, it can be used for the subsequent manufacture of lenses, and it becomes possible to manufacture the lenses of uniform characteristics.

Although, in the present embodiment, such glassy carbon has been employed, a similar effect can be achieved even with another glassy carbon, for example, one under the tradename "Glassycarbon" or one under the tradename "Cellulose-carbon".

Figure 22:
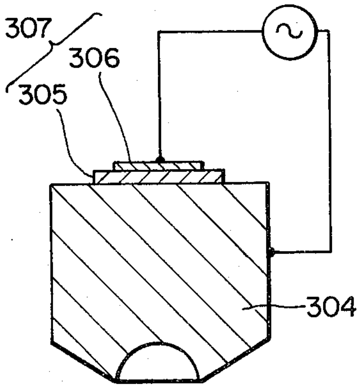

In the spherical lens 304 fabricated by the above method, one end face is optically polished into a flat surface, and as shown in FIG. 22, a piezoelectric thin film 305 of zinc oxide or the like is deposited directly on the flat surface by a process such as sputtering and is overlaid with an upper electrode 306 by evaporation. Thus, a piezoelectric transducer 307 is formed.

The present embodiment has the advantage that the spherical lens 304 functions as a lower electrode and simultaneously holds the ground potential when contacted with a case (not shown), thereby serving for electrostatic shielding.

As set forth above, according to this invention, natural or artificial bubbles in glass are used or spherical holes obtained by polishing or from the bubbles are transferred, whereby acoustic spherical lenses for focusing high frequency acoustic waves can be industrially produced in large quantities without relying on the masterly performance-like polishing. The effect of this invention is greatly mighty in various industrial apparatuses employing focused beams of high frequency acoustic waves, for example, an acoustic microscope, an ultrasonic spectroscopy, and a non-destructive testing instrument for revealing a small area.

We claim:

1. An acoustic spherical lens comprising:

propagating means for forming a solid acoustic energy propagating medium; and piezoelectric transducer means for generating acoustic energy disposed on one side of the propagating means, wherein the other side of the propagating means is provided with the shape of a concave spherical surface comprising a bubble surface formed by gaseous expansion in said propagating means and a taper surface except in the region of the concave spherical surface.

2. An acoustic spherical lens according to claim 1, wherein said concave spherical surface is a hemispherical surface.

3. An acoustic spherical lens according to claim 1, wherein said propagating medium is made of a material selected from the group consisting of silica, fused silica, quartz, glassy carbon, flint glass, Kovar glass, crown glass and T-40 glass.

4. An acoustic spherical lens according to claim 1, wherein a diameter of said concave spherical surface is designed between 10 microns and 500 microns.

5. An acoustic spherical lens according to claim 1, wherein a fluid acoustic energy propagating medium is filled between said solid acoustic energy propagating medium and an object.

6. An acoustic spherical lens according to claim 5, wherein said fluid medium is water.

* * * * *